US010570705B2

(12) United States Patent
Fleming et al.

(10) Patent No.: US 10,570,705 B2
(45) Date of Patent: Feb. 25, 2020

(54) MANAGING A NETWORK OF WELLS AND SURFACE FACILITIES BY FINDING A STEADY-STATE FLOW SOLUTION FOR A PIPE SUB-NETWORK

(71) Applicant: Landmark Graphics Corporation, Houston, TX (US)

(72) Inventors: Graham Christopher Fleming, Houston, TX (US); Jie Ma, Katy, TX (US)

(73) Assignee: Landmark Graphics Corporation, Houston, TX (US)

( * ) Notice: Subject to any disclaimer, the term of this patent is extended or adjusted under 35 U.S.C. 154(b) by 347 days.

(21) Appl. No.: 15/575,561

(22) PCT Filed: Nov. 4, 2016

(86) PCT No.: PCT/US2016/060617
§ 371 (c)(1),
(2) Date: Nov. 20, 2017

(87) PCT Pub. No.: WO2018/084856
PCT Pub. Date: May 11, 2018

(65) Prior Publication Data
US 2019/0211651 A1 Jul. 11, 2019

(51) Int. Cl.
*G06G 7/48* (2006.01)
*E21B 41/00* (2006.01)
(Continued)

(52) U.S. Cl.
CPC .......... *E21B 41/0092* (2013.01); *E21B 43/00* (2013.01); *E21B 47/06* (2013.01);
(Continued)

(58) Field of Classification Search
CPC ...... E21B 41/0092; E21B 43/00; E21B 47/06; G06F 17/5009; F17D 3/01
(Continued)

(56) References Cited

U.S. PATENT DOCUMENTS 7,668,707 B2 2/2010 Watts et al.
8,600,717 B2 12/2013 Rashid et al.
(Continued)

FOREIGN PATENT DOCUMENTS

| EP | 0561492 A2 | 9/1993 |
| EP | 1358619 B1 | 11/2007 |
| WO | 2011025471 A1 | 3/2011 |
| WO | 2013187915 A2 | 12/2013 |

OTHER PUBLICATIONS

B.K. Coates, G.C. Gleming, J.W. Watts, M. Rame and G.S. Shiralkar, "A Generalized Wellbore and Surface Facility Model, Fully Coupled to a Reservoir Simulator." SPE-87913-PA, SPE Journal 7(2): 132-142, Apr. 2004.
(Continued)

*Primary Examiner* — Andre Pierre Louis
(74) *Attorney, Agent, or Firm* — Jason Sedano; C. Tumey Law Group PLLC

(57) ABSTRACT

A method of managing a network of wells and surface facilities includes partitioning the network to obtain a pipe sub-network and two or more well sub-networks, and constructing an associated set of equations that represent a steady-state fluid flow in the sub-network. The method further includes setting boundary conditions for each well sub-network, and determining a steady-state flow solution for each well sub-network. The method further includes establishing boundary conditions for the pipe sub-network, and finding a steady-state flow solution for the pipe sub-network. If the solution does not match the estimated pressure, the method further includes adjusting the estimated (Continued)

pressure, repeating said setting, determining, establishing, finding, and adjusting operations until the calculated and estimated pressures converge, and analyzing flow rates of the steady-state flow solutions to evaluate suitability of a modification to the network.

20 Claims, 3 Drawing Sheets

(51) Int. Cl.
  *F17D 3/01* (2006.01)
  *G06F 17/50* (2006.01)
  *E21B 43/00* (2006.01)
  *E21B 47/06* (2012.01)
  *E21B 47/10* (2012.01)
  *G06G 7/50* (2006.01)

(52) U.S. Cl.
  CPC ............... *E21B 47/10* (2013.01); *F17D 3/01* (2013.01); *G06F 17/5009* (2013.01)

(58) Field of Classification Search
  USPC ...................................................... 703/9, 10
  See application file for complete search history.

(56) References Cited

U.S. PATENT DOCUMENTS

| | | | |
|---|---|---|---|
| 2005/0288875 A1* | 12/2005 | Sugioka | B01L 3/50273 702/50 |
| 2014/0090888 A1 | 4/2014 | Smith et al. | |
| 2015/0134314 A1 | 5/2015 | Lu et al. | |
| 2015/0339412 A1* | 11/2015 | Vitaletti | G06Q 50/06 703/1 |
| 2017/0175513 A1* | 6/2017 | Chen | E21B 43/00 |

OTHER PUBLICATIONS

G.S. Shiralker and J.W. Watts, "An Efficient Formulation for Simultaneous Solution of the Surface Network Equations." SPE-93073, presented at the SPE Symposium on reservoir Simulation, Houston, Texas, Jan. 31-Feb. 2, 2005.

International Searching Authority, Patent Cooperation Treaty, International Search Report and Written Opinion, International application No. PCT/US2016/060617, which is a PCT parent to the instant application, dated Jul. 17, 2017.

J.W. Watts, G. C. Fleming and Q. Lu, "Determination of Active Constraints in a Network," SPE-11887-PA, presented at the SPE Symposium on Reservoir Simulation, Woodlands, Texas, Feb. 2-4, 2009. To be published in the SPE Journal.

\* cited by examiner

MANAGING A NETWORK OF WELLS AND SURFACE FACILITIES BY FINDING A STEADY-STATE FLOW SOLUTION FOR A PIPE SUB-NETWORK

BACKGROUND

In the oil and gas industry, reservoir monitoring, sometimes referred to as reservoir surveillance, involves the regular collection and monitoring of measured production data from within and around the wells of a reservoir. Such data may include, but is not limited to, water saturation, fluid pressure, fluid flow rates, fluid temperature, and the like. As the data is collected, it is archived into a historical database.

The archived data, however, mostly reflects conditions immediately around the reservoir wells. Simulations can model the overall behavior of the entire network of wells and surface facilities based on the data, both current and historical, to provide a more complete picture. These simulations produce simulated interwell data both near and at a distance from the wells. Simulated near-well data is correlated against measured near-well data, and the modeling parameters are adjusted as needed to reduce the error between the simulated and measured data. Once so adjusted, the simulated interwell data, both near and at a distance from the well, may be relied upon to assess the overall state of the network of wells and surface facilities. Such data may also be relied upon to predict future behavior based upon either actual or hypothetical conditions input by an operator of the simulator.

However, such simulations, particularly those that perform full-physics numerical simulations of large reservoirs, are computationally intensive and can take hours, even days, to execute. Additionally, the simulations use equations that are highly non-linear, and often require damping in order for the iterations to converge. As a result, nonlinearities in one part of the network can cause slow convergence of the solution for the entire network. Finally, solving the network equations in parallel results in an overwhelming amount of dependencies and messages. Specifically, some processes in the parallel solving algorithm are dependent upon the results of other processes and must wait for the other processes to resolve and send a message with the results. As the number of wells in a network increase, in some cases to over 1,000 wells, these dependencies and messages constitute a majority of the computation time.

BRIEF DESCRIPTION OF THE FIGURES

Accordingly, to mitigate or eliminate the problems identified above, systems and methods of managing a network of wells and surface facilities by finding a steady-state flow solution for a pipe sub-network are disclosed herein. In the following detailed description of the various disclosed embodiments, reference will be made to the accompanying drawings in which.

Figure 1:
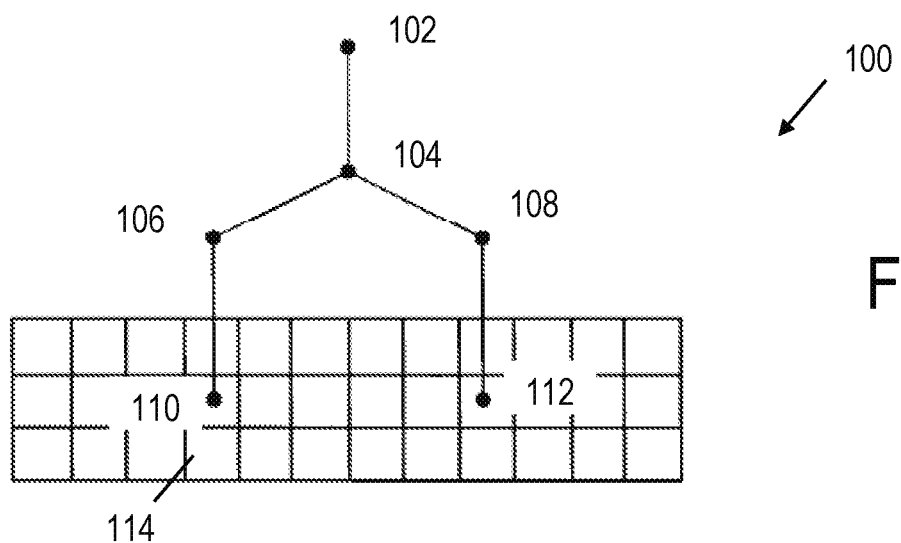
FIG. 1 is a diagram of an illustrative network of wells, reservoir grid, and surface facilities.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

NOTATION AND NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

DETAILED DESCRIPTION

The issues identified in the background are at least partly addressed by systems and methods of managing a network of wells and surface facilities by finding steady-state flow solutions for a pipe sub-network. FIG. 1 is a diagram of an illustrative network 100 of wells 106, 108, a reservoir grid 114, and a surface facility 102. The network 100 has a tree-like structure, with each branch of the tree structure being a well 106, 108. The wells 106, 108 join at a common gathering node 104, which is coupled to the surface facility 102. The surface facility 102 may be a sink or source. A sink, such as a storage tank, receives hydrocarbons from the wells 106, 108. A source delivers fluids, such as fracturing fluid or water, to the wells 106, 108. For clarity of discussion, only two wells 106, 108, one gathering node 104, and one surface facility 102 are illustrated. However, in various embodiments any number of wells, gathering nodes, and surface facilities may be managed. Additionally, any number of wells may be coupled to a gathering node while another number of wells may be coupled to a different gathering node. Finally, some wells may be production wells (coupled to a sink), while other wells may be injection wells (coupled to a source).

A reservoir simulator links the simulation of the reservoir grid 114 and the simulation of the network 100 of wells 106, 108 through shared, or perforation, nodes 110, 112 at which hydrocarbons pass from the reservoir grid 114 to the wells 106, 108. For example, the shared nodes 110, 112 may be perforation locations that allow hydrocarbons to pass from the reservoir grid 114 to the wells 106, 108. In at least some embodiments, one or more shared nodes 110, 112 are locations at which injection fluids are passed from the wells 106, 108 to the reservoir grid 114. For example, such injection fluids may include fracturing fluid, water, and the like.

Measured well data is collected regularly from each well 106, 108 to track changing conditions in the reservoir. These measurements may be taken using a number of different downhole and surface instruments or sensors, including but not limited to, temperature and pressure sensors, flow meters, and the like. Such measured data may be used to determine derived data. For example, derived data such as fluid flow rates, fluid compositions, and pressure distributions of the network 100 may be solved with numerical models including a set of equations. The equations include mass balance equations at various nodes, hydraulic equations or constraint equations for each edge, perforation equations for the reservoir grid 114/well 106, 108 interface, equations for specific variables such as maximum flow rate and source composition, and the like. A constraint is a physical limitation, often represented as a maximum or minimum threshold value, of a certain section of the network 100. Constraints include, but are not limited to, a water production flow rate limit, an oil production flow rate limit, a gas production flow rate limit, a fluid pressure limit, a liquid injection flow rate limit, a gas injection flow rate limit, a maximum pressure drawdown for a well, a maximum power or speed for a compressor or pump, a device setting such as a choke diameter, and the like. Simulators use well and production data, along with constraints, to identify optimal operation settings, expressed as a solution to a set of equations, that provides the greatest hydrocarbon production without exceeding any constraints.

Figure 2:
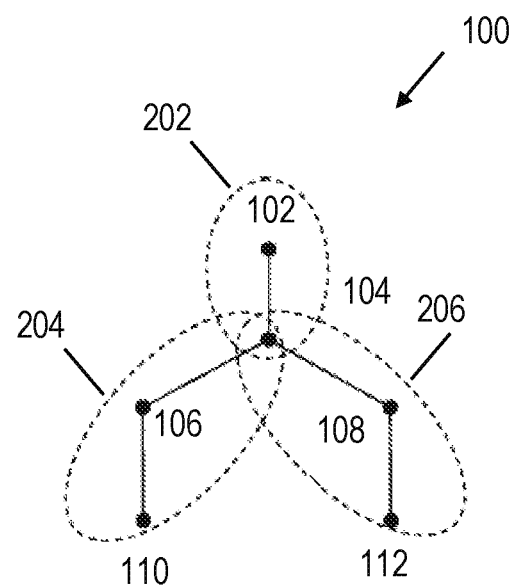
FIG. 2 is a diagram showing the decomposition of an illustrative network into well sub-networks and a pipe sub-network.

FIG. 2 is a diagram showing the decomposition of the network 100 of wells 106, 108 into well sub-networks 204, 206 and a pipe sub-network 202. For clarity of discussion, only two well sub-networks 204, 206 are illustrated, and only one pipe 202 sub-network is illustrated. However, in various embodiments many well sub-networks and pipe sub-networks may be used among many wells 106, 108. The equations for simulation of the well sub-networks 204, 206 may be solved by different processes in parallel. For example, different processing threads, processing cores, processors, or computer systems may be used to solve the different well sub-networks 204, 206. The equations for simulation of different pipe sub-networks 202 (if more than one) may also be solved by different processes in parallel, but in at least one embodiment, are solved subsequent to the well sub-networks 204, 206 per iteration.

As an example of such subsequent solving, in at least one embodiment, the solution to the equations for each well sub-network 204, 206 is iterated to convergence using the pressure at the gathering node 104 as a boundary condition for the wells 106, 108 if they are producing wells. If the wells 106, 108 are injection wells, the composition at the gathering node 104, in addition to the pressure at the gathering node, is used as the boundary condition in at least one embodiment. From the solution of each well sub-network 204, 206, the flow rate of each hydrocarbon component flowing into the gathering node 104 and the derivative of the flow rate with respect to pressure is obtained. These flow rates, as a linear function of pressure, are summed at the gathering node 104 for each contributing well sub-network 204, 206, providing source equations (or a sink equation in the case of an injection well), for the pipe sub-network 202.

The solution to the equations for the pipe sub-network 202 may then be iterated to convergence. In some cases, solving for the pipe sub-network 202 may result in the calculated pressure at the gathering node 104 changing. If such a change occurs, the computations for the well sub-networks 204, 206 and pipe sub-network 202 may be iterated, incorporating the change, until the difference between two calculated gathering node pressures is less than a predetermined threshold.

For large networks, such iteration is more efficient than solving for the entire network 100 in parallel because non-linearities that require damping in one of the well sub-networks 204, 206 do not affect the number of iterations required by other well sub-networks 204, 206 or the pipe sub-network 202. Also, the well sub-networks 204, 206 may be solved in parallel on multiple processes with only a small amount of communication required before the pipe sub-networks 202 may be solved. Accordingly, delays due to dependencies or messaging described above are minimized or eliminated.

Figure 3:
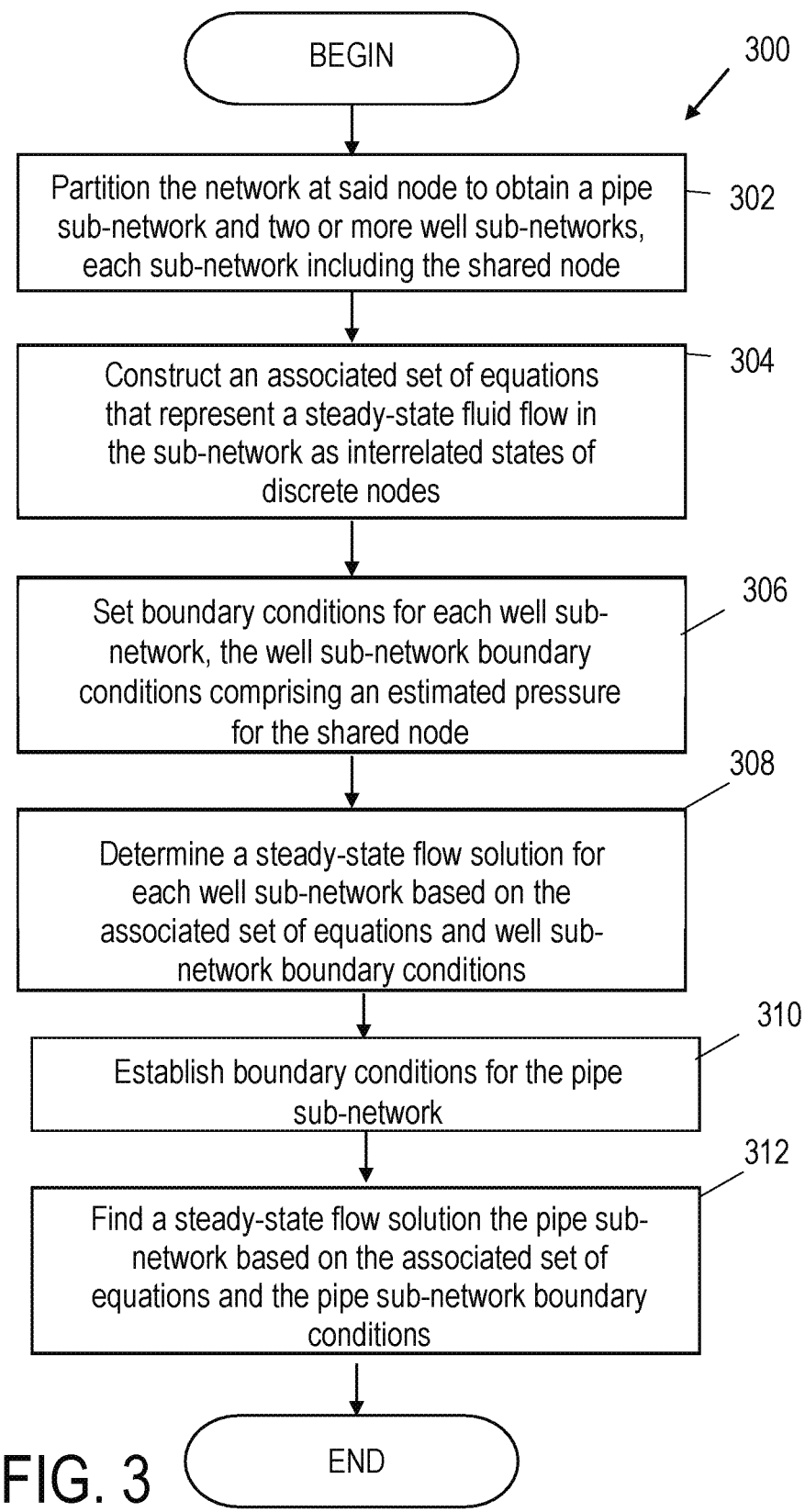
FIG. 3 is a flow diagram of an illustrative method of managing a network of wells and surface facilities.

FIG. 3 is a flow diagram of an illustrative method 300 of managing a network 100 of wells 106, 108 and surface facilities 102 that may be performed at least in part by one or more processors coupled to memory. The memory may include instructions, which when executed by the one or more processors, cause the one or more processors to perform an action described below. The one or more processors may be part of a system 402 (described below) that implements an action described below.

The network 100 may have a tree-like structure with at least one node shared by three or more edges. For example, the gathering node 104 is shared by three edges representing flow paths of a gathering/distribution pipe and at least two wells 106, 108. The wells 106, 108 may be any combination of production wells and injection wells.

At 302, the system 402 partitions the network 100 at the gathering node 104 to obtain a pipe sub-network 202 and two well sub-networks 204, 206. Each sub-network 202, 204, 206 includes the gathering node 104. In this way, for a network with many wells, many partitions may be created resulting in many well sub-networks and many pipe sub-networks. Multiple gathering nodes may be shared by different numbers of well-subnetworks and pipe sub-networks as well.

At 304, the system 402 constructs, for each sub-network 202, 204, 206, an associated set of equations that represent a steady-state fluid flow in the sub-network 202, 204, 206 as interrelated states of discrete nodes, or locations in the network. Specifically, the equations describe the flow of fluids through the network 100 while adhering to constraints. The set of equations may be implemented as a model that receives as input a subset of variables of the network 100 and calculates as output a different subset of variables. For example, a model for a reservoir may include variables such as production system measurements (both surface and well measurements), historical reservoir measurements, fluid characterization data, liquid volume fraction, solution gas-oil ratio, formation volume factor, and the like. A model for the sub-networks 202, 204, 206 and the surface facility 102 may include variables such as pressure, temperature, fluid flow measurements, gas lift injection rates, reservoir gas injection rates, reservoir liquid injection rates, and the like at variable locations such as downhole near the well perforations, along the production string, at the wellhead, within the sub-networks 202, 204, 206 prior to the point where the fluids mix with fluids from other reservoirs, and the like.

The equations may include mass/volume balance equations representative of the reservoir, of perforations, and of the sub-networks 202, 204, 206. The equations may also include molar balance equations, hydraulic equations, constraint equations, perforation equations, composition equations, and the like. Additionally, the equations may account for multiple fluid components. For example, the mass of each component flowing into and out of a node must be conserved, and a stock tank oil rate constraint requires feeding the fluid composition flowing in an edge through a separator battery to obtain the resulting oil phase rate.

At 306, the system 402 sets boundary conditions for each well sub-network 204, 206, such as an estimated pressure at the gathering node 104 as a boundary condition for the wells 106, 108 if they are producing wells. If the wells 106, 108 are injection wells, the composition at the gathering node 104, in addition to the pressure at the gathering node, is used as the boundary condition in at least one embodiment.

At 308, the system 402 determines a steady-state flow solution for each well sub-network 204, 206 based on the associated set of equations and boundary conditions. A Newton-Raphson technique may be applied to identify a solution within the constraints. Specifically, the solution describes modifiable operating settings within the constraints. Such operating settings include, but are not limited to, well choke settings, well gas lift injection flow rates, reservoir gas injection rates, reservoir liquid injection flow rates, a fluid composition, a flow rate for each fluid component, a pressure derivative of the flow rate for each fluid component, and the like. As such, the system 402 obtains a pressure-dependent flow rate for each fluid component at the gathering node 104. For example, a facility may be able to process no more than 100,000 STB/day of oil, so the production wells may have oil rate constraints imposed so that the sum of the individual well oil rates does not exceed the facility limit.

At 310, the system 402 establishes boundary conditions for the pipe sub-network 202. In at least one embodiment, the boundary condition is a summation of the pressure-dependent flow rates for each fluid component at the gathering node 104. At 312, the system 402 finds a steady-state flow solution for the pipe sub-network 202 based on the associated set of equations and the pipe sub-network 202 boundary conditions. In at least one embodiment, the solution includes a calculated pressure at the gathering node 104. If the calculated pressure does not match the estimated pressure, the method 300 further includes adjusting the estimated pressure in the direction of the calculated pressure and repeating the setting, determining, establishing, finding, and adjusting operations until the calculated and estimated pressures converge.

Figure 4:
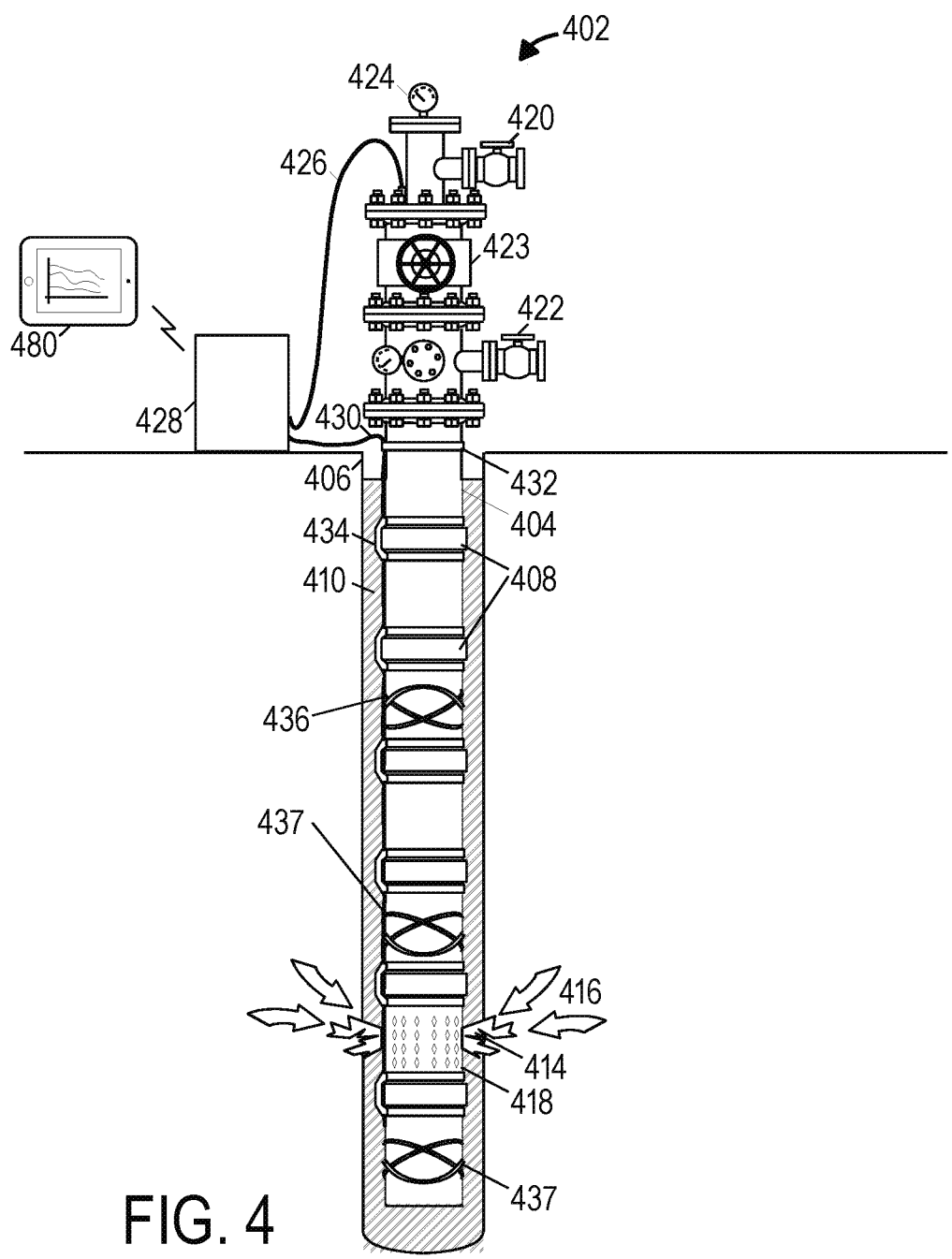
FIG. 4 is a contextual view of an illustrative production well that may be part of a system of managing a network of wells and surface facilities.

The method 300 may also include analyzing flow rates of the steady-state flow solutions to evaluate suitability of a modification to the network and displaying flow rates of the steady-state flow solutions while recommending the modification. The modification may include enlarging a choke opening, reducing a choke opening, shutting in a well, reopening a well, performing a workover, plugging a perforation, shooting a new perforation, changing tubing, drilling a new well, adjusting an artificial lift, adjusting a gaslift rates, changing ESP power, adding an artificial lift, adding a gaslift rate, switching a well to a different separation system, adjusting a downhole valve, and the like. For example, operating settings may be presented to the user, and in at least some embodiments may be used to manually adjust network 100 settings. In other embodiments, at least some of the operating settings are transmitted to field equipment by the system 402 via telemetry to implement the modifications automatically, i.e. without human input. FIG. 4 illustrates such equipment in at least one embodiment.

FIG. 4 is a contextual view of an illustrative production environment that may employ a system 402 of managing a network 100 of wells 106, 108 and surface facilities 102. A casing string 404 is positioned in a borehole 406 that has been formed in the earth by a drill bit, and the casing string 404 includes multiple casing tubulars (usually 30 foot long steel tubulars) connected end-to-end by couplings 408. Alternative casing types include continuous tubing and, in some rare cases, composite (e.g., fiberglass) tubing. Cement 410 has been injected between an outer surface of the casing string 404 and an inner surface of the borehole 406, and the cement 410 has been allowed to set. The cement 410 enhances the structural integrity of the well and seals the annulus around the casing 404 against undesired fluid flows. Though well is shown as entirely cemented, in practice certain intervals may be left without cement, e.g., in horizontal runs of the borehole where it may be desired to facilitate fluid flows.

Perforations 414 have been formed at one or more positions along the borehole 406 to facilitate the flow of a fluid 416 from a surrounding formation into the borehole 406 and thence to the surface. The casing string 404 may include pre-formed openings 418 in the vicinity of the perforations 414, or it may be perforated at the same time as the formation. Typically, the well is equipped with a production tubing string positioned in an inner bore of the casing string 404. One or more openings in the production tubing string accept the borehole fluids and convey them to the earth's surface and onward to storage and/or processing facilities via a production outlet 420. The wellhead may include other ports such as a port 422 for accessing the annular space(s) and a blowout preventer 423 for blocking flows under emergency conditions. Various other ports and feedthroughs are generally included to enable the use of external sensors 424 and internal sensors. A cable 426 couples such sensors to a well interface system 428.

The interface system 428 typically supplies power to the transducers and provides data acquisition and storage, possibly with some amount of data processing. A monitoring system is coupled to the interface system 428 via an armored cable 430, which is attached to the exterior of the casing string 404 by straps 432 and protectors 434. Protectors 434 guide the cable 430 over the collars 408 and shield the cable 430 from being pinched between the collar 408 and the borehole wall. The cable 430 connects to one or more electromagnetic transducer modules 436, 437 attached to the casing string 404. Each of the transducer modules 436, 437 may include a layer of nonconductive material having a high permeability to reduce interference from casing effects.

The EM transducer modules 436 can transmit or receive arbitrary waveforms, including transient (e.g., pulse) waveforms, periodic waveforms, and harmonic waveforms. The transducer modules 437 can further measure natural EM fields including magnetotelluric and spontaneous potential fields. Without limitation, suitable EM signal frequencies for reservoir monitoring include the range from 1 Hz to 10 kHz. In this frequency range, the modules may be expected to detect signals at transducer spacings of up to about 200 feet, though of course this varies with transmitted signal strength and formation conductivity. Higher signal frequencies may also be suitable for some applications, including frequencies as high as 500 kHz, 2 MHz, or more.

FIG. 4 further shows a processor unit 480 that communicates wirelessly with the well interface system 428 to obtain and process measurement data and to provide a representative display of the information to a user. The processor unit 480 is coupled to memory, which includes executable instructions that, when executed, cause the one or more processors to perform an action described above. The processor unit 480 may also communicate directly with the downhole environment. The processor unit 480 can take different forms including a tablet computer, laptop computer, desktop computer, and virtual cloud computer. The processor unit 480 may also be part of a distributed processing system including uphole processing, downhole processing, or both. Whichever processor unit embodiment is employed includes software that configures the unit's processor(s) to carry out an action described above and to enable the user to view and preferably interact with a display of the resulting information. In at least some illustrative embodiments, the above-described production system simulation is implemented in software that executes on a computer system, which in at least some illustrative embodiments implements at least part of the method 300 in FIG. 3.

In some aspects, systems, methods, and apparatuses for managing a network of wells and surface facilities are provided according to one or more of the following examples. In at least one embodiment, a method of managing a network of wells and surface facilities with at least one node shared by three or more edges, the edges representing flow paths of a gathering/distribution pipe and at least two wells, includes partitioning the network at the node to obtain a pipe sub-network and two or more well sub-networks, each sub-network including the shared node. The method further includes, for each sub-network, constructing an associated set of equations that represent a steady-state fluid flow in the sub-network as interrelated states of discrete nodes. The method further includes setting boundary conditions for each well sub-network, the well sub-network boundary conditions including an estimated pressure for the shared node. The method further includes determining a steady-state flow solution for each well sub-network based on the associated set of equations and well sub-network boundary conditions, the solution including a fluid composition, a flow rate for each fluid component, and a pressure derivative of the flow rate for each fluid component, thereby obtaining a pressure-dependent flow rate for each fluid component at the shared node. The method further includes establishing boundary conditions for the pipe sub-network, the pipe sub-network boundary conditions including a summation of the pressure-dependent flow rates for each fluid component at the shared node. The method further includes finding a steady-state flow solution for the pipe sub-network based on the associated set of equations and the pipe sub-network boundary conditions, the solution including a calculated pressure at the shared node. If the calculated pressure does not match the estimated pressure, the method further includes adjusting the estimated pressure, repeating the setting, determining, establishing, finding, and adjusting operations until the calculated and estimated pressures converge, and analyzing flow rates of the steady-state flow solutions to evaluate suitability of a modification to the network.

In another embodiment, a system for managing a network of wells and surface facilities with at least one node shared by three or more edges, the edges representing flow paths of a gathering/distribution pipe and at least two wells, includes one or more processors and memory coupled to the one or more processors. The memory includes executable instructions that, when executed, cause the one or more processors to partition the network at the node to obtain a pipe sub-network and two or more well sub-networks, each sub-network including the shared node. The one or more processors are further caused to, for each sub-network, construct an associated set of equations that represent a steady-state fluid flow in the sub-network as interrelated states of discrete nodes. The one or more processors are further caused to set boundary conditions for each well sub-network, the well sub-network boundary conditions including an estimated pressure for the shared node. The one or more processors are further caused to determine a steady-state flow solution for each well sub-network based on the associated set of equations and well sub-network boundary conditions, the solution including a fluid composition, a flow rate for each fluid component, and a pressure derivative of the flow rate for each fluid component, thereby obtaining a pressure-dependent flow rate for each fluid component at the shared node. The one or more processors are further caused to establish boundary conditions for the pipe sub-network, the pipe sub-network boundary conditions including a summation of the pressure-dependent flow rates for each fluid component at the shared node. The one or more processors are further caused to find a steady-state flow solution for the pipe sub-network based on the associated set of equations and the pipe sub-network boundary conditions, the solution including a calculated pressure at the shared node. If the calculated pressure does not match the estimated pressure, the one or more processors are further caused to adjust the estimated pressure, repeat the setting, determining, establishing, finding, and adjusting operations until the calculated and estimated pressures converge, and analyze flow rates of the steady-state flow solutions to evaluate suitability of a modification to the network.

The following features may be incorporated into the various embodiments described above, such features incorporated either individually in or conjunction with one or more of the other features. The modification may include enlarging a choke opening, reducing a choke opening, shutting in a well, reopening a well, performing a workover, plugging a perforation, shooting a new perforation, changing tubing, drilling a new well, adjusting an artificial lift, adjusting a gaslift rates, changing ESP power, adding an artificial lift, adding a gaslift rate, switching a well to a different separation system, adjusting a downhole valve, and the like. At least one set of equations may include a mass balance equation for at least one node and a hydraulic equation for at least one edge. At least one set of equations may include a constraint equation for at least one node or edge. The set of equations associated with a well subnetwork may include a perforation equation. The method may further include displaying flow rates of the steady-state flow solutions. At least one set of equations may account for multiple fluid components. At least one well may include a production well. At least one well may include an injection well. The method may further include automatically implementing the modification without human input. The one or more processors may be further caused to display flow rates of the steady-state flow solutions. The one or more processors may be further caused to automatically implement the modification without human input.

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A method of managing a network of wells and surface facilities with at least one node shared by three or more edges, the edges representing flow paths of a gathering/distribution pipe and at least two wells, the method comprising:

partitioning the network at said node to obtain a pipe sub-network and two or more well sub-networks, each sub-network including the shared node;

for each sub-network, constructing an associated set of equations that represent a steady-state fluid flow in the sub-network as interrelated states of discrete nodes;

setting boundary conditions for each well sub-network, the well sub-network boundary conditions comprising an estimated pressure for the shared node;

determining a steady-state flow solution for each well sub-network based on the associated set of equations and well sub-network boundary conditions, the solution including a fluid composition, a flow rate for each fluid component, and a pressure derivative of the flow rate for each fluid component, thereby obtaining a pressure-dependent flow rate for each fluid component at the shared node;

establishing boundary conditions for the pipe sub-network, the pipe sub-network boundary conditions including a summation of the pressure-dependent flow rates for each fluid component at the shared node;

finding a steady-state flow solution for the pipe sub-network based on the associated set of equations and the pipe sub-network boundary conditions, the solution including a calculated pressure at the shared node;

if the calculated pressure does not match the estimated pressure:

adjusting the estimated pressure; and repeating said setting, determining, establishing, finding, and adjusting operations until the calculated and estimated pressures converge; and analyzing flow rates of the steady-state flow solutions to evaluate suitability of a modification to the network.

2. The method of claim 1, wherein the modification is selected from the group consisting of: enlarging a choke opening, reducing a choke opening, shutting in a well, reopening a well, performing a workover, plugging a perforation, shooting a new perforation, changing tubing, drilling a new well, adjusting an artificial lift, adjusting a gaslift rates, changing ESP power, adding an artificial lift, adding a gaslift rate, switching a wells to a different separation system, and adjusting a downhole valve.

3. The method of claim 1, wherein at least one set of equations comprises a mass balance equation for at least one node and a hydraulic equation for at least one edge.

4. The method of claim 1, wherein at least one set of equations comprises a constraint equation for at least one node or edge.

5. The method of claim 1, wherein the set of equations associated with a well subnetwork comprises a perforation equation.

6. The method of claim 1, further comprising displaying flow rates of the steady-state flow solutions.

7. The method of claim 1, wherein at least one set of equations accounts for multiple fluid components.

8. The method of claim 1, wherein at least one well comprises a production well.

9. The method of claim 1, wherein at least one well comprises an injection well.

10. The method of claim 1, further comprising automatically implementing the modification without human input.

11. A system for managing a network of wells and surface facilities with at least one node shared by three or more edges, the edges representing flow paths of a gathering/distribution pipe and at least two wells, the system comprising:

one or more processors;

memory coupled to the one or more processors;

the memory comprising executable instructions that, when executed, cause the one or more processors to:

partition the network at said node to obtain a pipe sub-network and two or more well sub-networks, each sub-network including the shared node;

for each sub-network, construct an associated set of equations that represent a steady-state fluid flow in the sub-network as interrelated states of discrete nodes;

set boundary conditions for each well sub-network, the well sub-network boundary conditions comprising an estimated pressure for the shared node;

determine a steady-state flow solution for each well sub-network based on the associated set of equations and well sub-network boundary conditions, the solution including a fluid composition, a flow rate for each fluid component, and a pressure derivative of the flow rate for each fluid component, thereby obtaining a pressure-dependent flow rate for each fluid component at the shared node;

establish boundary conditions for the pipe sub-network, the pipe sub-network boundary conditions including a summation of the pressure-dependent flow rates for each fluid component at the shared node;

find a steady-state flow solution the pipe sub-network based on the associated set of equations and the pipe sub-network boundary conditions, the solution including a calculated pressure at the shared node;

if the calculated pressure does not match the estimated pressure:

adjust the estimated pressure; and repeat said setting, determining, establishing, finding, and adjusting operations until the calculated and estimated pressures converge; and analyze flow rates of the steady-state flow solutions to evaluate suitability of a modification to the network.

12. The system of claim 11, wherein the modification is selected from the group consisting of: enlarging a choke opening, reducing a choke opening, shutting in a well, reopening a well, performing a workover, plugging a perforation, shooting a new perforation, changing tubing, drilling a new well, adjusting an artificial lift, adjusting a gaslift rates, changing ESP power, adding an artificial lift, adding a gaslift rate, switching a wells to a different separation system, and adjusting a downhole valve.

13. The system of claim 11, wherein at least one set of equations comprises a mass balance equation for at least one node and a hydraulic equation for at least one edge.

14. The system of claim 11, wherein at least one set of equations comprises a constraint equation for at least one node or edge.

15. The system of claim 11, wherein the set of equations associated with a well subnetwork comprises a perforation equation.

16. The system of claim 11, wherein the one or more processors are further caused to display flow rates of the steady-state flow solutions.

17. The system of claim 11, wherein at least one set of equations accounts for multiple fluid components.

18. The system of claim 11, wherein at least one well comprises a production well.

19. The system of claim 11, wherein at least one well comprises an injection well.

20. The system of claim 11, wherein the one or more processors are further caused to automatically implement the modification without human input.

* * * * *